United States Patent [19]

Boll et al.

[11] Patent Number: 5,373,231
[45] Date of Patent: Dec. 13, 1994

[54] INTEGRATED CIRCUIT PROBING APPARATUS INCLUDING A CAPACITOR BYPASS STRUCTURE

[75] Inventors: Gregory G. Boll; Harry J. Boll, both of Naples, Fla.

[73] Assignee: G. G. B. Industries, Inc., Naples, Fla.

[21] Appl. No.: 75,139

[22] Filed: Jun. 10, 1993

[51] Int. Cl.⁵ .............................................. G01R 1/04
[52] U.S. Cl. ........................... 324/158.1; 324/537
[58] Field of Search ............... 324/158 F, 158 P, 687, 324/537, 725

[56] References Cited

U.S. PATENT DOCUMENTS 4,764,723  8/1988  Strid ................................. 324/158
4,871,964  10/1989  Boll et al. ........................ 324/158

*Primary Examiner*—Kenneth A. Wieder
*Assistant Examiner*—Barry C. Bowser
*Attorney, Agent, or Firm*—Irwin Ostroff; Erwin W. Pfeifle

[57] ABSTRACT

A device for testing the performance of high speed integrated circuits (ICs) while in wafer form or separated from the wafer which includes first and second spaced-apart probes fixedly mounted on a support member for accurately positioning the first and second probes in three dimensions for contacting at least one first point and a second point, respectively, on an IC under test. The first and second probes are interconnected at a predetermined portion of their length by a capacitor means which provides sufficient flexibility so as to facilitate independent movement of the first and second probes and avoid introducing parameters (e.g., inductance) which interfere with high speed testing of the IC. In one embodiment, the first probe is a transmission line probe (e.g., a coaxial line) and the second probe is a wire probe for supplying power to the second point on the IC. In a another embodiment, the first and second probes are wire probes for providing a reference potential and power, respectively, to respective first and second points on the IC. The capacitor means can consist of just a foil type capacitor, or a capacitor in series with a flexible metal strip having dimensions to minimize inductance for electrically interconnecting the first and second probes. The capacitor functions to block direct current and pass A.C. signals when required.

32 Claims, 4 Drawing Sheets

INTEGRATED CIRCUIT PROBING APPARATUS INCLUDING A CAPACITOR BYPASS STRUCTURE

FIELD OF THE INVENTION

The invention relates to a probe device for testing high speed integrated circuits such as microwave amplifiers and very high speed digital circuits.

BACKGROUND OF THE INVENTION

Testing of integrated circuits (ICs), also called chips, is an important step in determining whether a design and manufacture have been successful in achieving a desired product. Advantageously, initial testing is performed while the chips are still held together as parts of a semiconductor wafer. If testing shows that the performance is defective in some way, then the design, or perhaps the processes employed in fabricating the wafer, can be altered to achieve a desired result.

With the development of higher speed ICs have come special problems resulting from the inherent inductance of the probe wires that are used in testing the ICs. The inductance of a standard probe wire is much too large to permit accurate testing at frequencies above about 100 MHz. Probing apparatus such as that disclosed in U.S. Pat. No. 4,871,964 (Boll et al.), issued on Oct. 3, 1989 and assigned to the same assignee as the present invention, is highly effective for testing ICs up to very high speeds and has been used at frequencies up to 120 GHz. Generally, very high speed prior art techniques tend to be unnecessarily expensive when accuracy is not important or when the ICs or circuits being tested are not high speed.

Still further, applying power to a circuit on a chip during testing can present serious problems. The circuit demands more or less current from the power lead as the internal circuits on the chip switch on and off during testing. The inductance of a probe wire that supplies the electrical current causes the voltage supplied to the chip to vary as the current demanded by the circuit increases and decreases.

A technique for supplying relatively stable power through low impedance transmission lines which use an inflexible capacitor is described in U.S. Pat. No. 4,764,723 (E. Strid), issued on Aug. 16, 1988. More particularly, a wafer probe is disclosed comprising transmission lines having a first impedance, and power supply conductors having a second impedance which is lower than the first impedance, and ground conductors. The transmission lines and the power supply conductors are formed on a first level of a substrate while the ground conductors are formed on a second layer of the substrate. The substrate is tapered so that the transmission lines and power conductors converge to engage minutely spaced bonding pads on a wafer being tested. Fixed bypass networks, such as bypass capacitors, are optionally located where test apparatus is joined to the wafer probe. Accordingly, this structure is relatively complex and more expensive to implement than is desirable in some applications.

It is desirable to provide a probe device for testing high speed integrated circuits and very high speed digital circuits that connects various portions of a circuit on a chip to a testing apparatus for analysis. Still further, it is desirable to provide power during probe testing in a manner that is simple, flexible, and effective.

SUMMARY OF THE INVENTION

Viewed from one aspect, the present invention is directed to electronic probe testing apparatus for use in testing a circuit and providing electrical signals between the circuit to be tested and a testing apparatus during the testing of the circuit. The electronic probe testing apparatus comprises a first probe which is useful for making an electrical connection to at least one first point of the circuit to be tested, a second probe forming a wire probe which is useful for making contact and supplying power to a second point of the circuit to be tested, and capacitor means. The first and second probes are disposed in a predetermined spaced-apart relationship to each other. The capacitor means capacitively couples the first and second probes and comprises a first terminal which is electrically connected to the first probe and a second terminal which is electrically connected to the second probe. Still further, the capacitor means is flexible so as to facilitate independent movement of the first and second probes so as to facilitate contacting of the first and second points, respectively, of the circuit during testing thereof.

Viewed from a second aspect, the present invention is directed to an electronic probe testing apparatus for use in testing a circuit and providing electrical signals between the circuit to be tested and a testing apparatus during the testing of the circuit. The electronic probe testing apparatus comprises a transmission line probe for contacting at least one first point of the circuit to be tested, a wire probe which is useful for making contact and supplying power to a second point of the circuit to be tested, and a capacitor. The transmission line probe and the wire probe are disposed in a predetermined spaced-apart relationship to each other. The transmission line probe provides an essentially resistive impedance and comprises a first conductor and a second conductor separated by an insulating medium. Still further, a first end of the transmission line probe is adapted to contact the at least one first point of the circuit to be tested. The capacitor comprises a first metallic conductor which is electrically connected to one of the transmission line probe and the wire probe, a second metallic conductor is connected to the other one of the transmission line probe and the wire probe, and an insulating medium separating the first and second metallic conductors. The capacitor has dimensions which limits inductance thereof and sufficient flexibility to facilitate independent movement of the transmission line probe and the wire probe. Preferably, the transmission line probe is a coaxial line.

Viewed from a third aspect, the present invention is directed to an electronic probe testing apparatus for use in testing a circuit and providing electrical signals between the circuit to be tested and a testing apparatus during the testing of the circuit. The electronic probe testing apparatus comprises a transmission line probe adapted to contact at least one first point of the circuit to be tested, a wire probe which is useful for making contact and supplying power to a second point of the circuit to be tested, a capacitor, and an electrically conducting metallic strip. The transmission line probe and the wire probe are disposed in a predetermined spaced-apart relationship to each other. The transmission line probe provides an essentially resistive impedance and comprises a first conductor and a second conductor separated by an insulating medium. A first end of the transmission line probe is adapted to contact the at least one first point of the circuit to be tested. The capacitor comprises a first metallic conductor which is electrically connected to one of the transmission line probe and the wire probe, a second metallic conductor, and an insulating medium separating the first and second metallic conductors. The electrically conducting metallic-strip has a first end which is electrically connected to the other one of the transmission line probe and the wire probe, and an opposing second end which is electrically and mechanically connected to the second metallic conductor of the capacitor. Still further, the metallic strip has dimensions which limits inductance thereof and provides for sufficient flexibility so as to facilitate independent movement of the transmission line probe and the wire probe.

Viewed from a fourth aspect, the present invention is directed to an electronic probe testing apparatus for use in testing a circuit and providing electrical signals between the circuit to be tested and a testing apparatus during the testing of the circuit. The electronic probe testing apparatus comprises a first wire probe which is useful for making contact and supplying a reference potential to a first point of the circuit to be tested, a second wire probe which is useful for making contact and supplying power to a second point of the circuit to be tested, and capacitor means. The first and second wire probes are disposed in a predetermined spaced-apart relationship to each other. The capacitor means comprises a first terminal which is electrically connected to the first wire probe and a second terminal which is electrically connected to the second wire probe. Still further, the capacitor means is flexible so as to facilitate independent movement of the first and second wire probes for contacting the first and second points, respectively, of the circuit to be tested.

The invention will be better understood from the following more detailed description taken in connection with the accompanying drawings.

The drawings are not necessarily to scale.

DETAILED DESCRIPTION

It is to be understood that corresponding designation numbers are used in the various figures for corresponding elements that have a same function.

Figure 1:
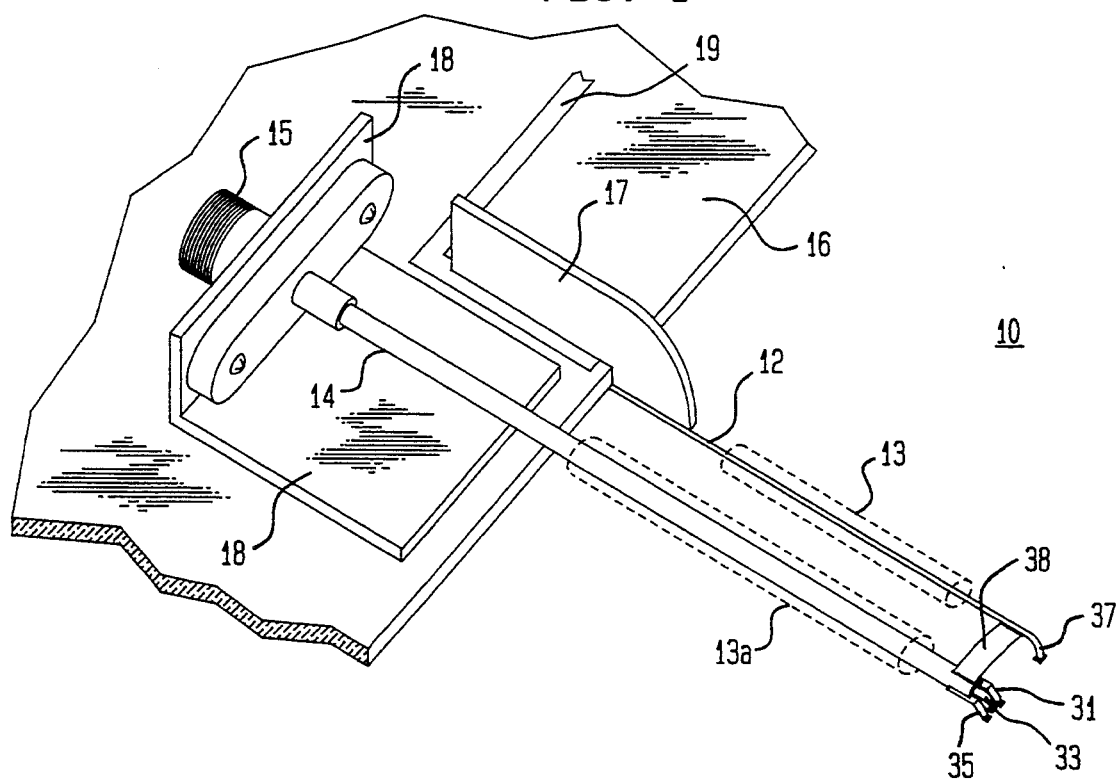
FIG. 1 is a perspective view of a probe device comprising a wire probe and a coaxial probe mounted on a probe card in accordance with the present invention.

Referring now to FIG. 1, there is shown a perspective view of a probe device 10 for testing high speed integrated circuits (ICs) in accordance with the present invention. The probe device 10 comprises a wire probe 12 with a microwave absorbing material 13 on a portion thereof, a coaxial probe 14 having a microwave absorbing material 13a on a portion thereof and a connector 15 for electrical connection to a test apparatus 69 (shown only in FIG. 3), a probe card 16, a first mounting structure 17, a second mounting structure 18, an electrically conducting line 19, and flexible capacitor means 38 electrically and mechanically interconnecting the wire probe 12 and the coaxial probe 14. The wire probe 12 and the coaxial probe 14 are mounted on the probe card 16 via the first and second mounting structures 17 and 18, respectively, so that tips 37 and 33 of the wire probe 12 and the coaxial probe 14, respectively, are held in a predetermined relationship to one another. More particularly, the first and second mounting structures 17 and 18 are affixed to the probe card 16 to facilitate the accurate positioning of the wire probe 12 and the coaxial probe 14 in three dimensions in order to bring the tips 37 and 33 of the wire probe 12 and the coaxial probe 14, respectively, in contact with associated metal pads 28 and 32, respectively, (only shown in FIGS. 2, 4, 5, and 6) of the integrated circuit chip under test. It is to be understood that the mounting structures 17 and 18 are shown as simple structures but can comprise any suitable structure for maintaining the tips of the probes 12 and 14 in their predetermined relationship. Microwave absorbing materials 13 and 13a, which each surround a portion of the wire probe 12 and the coaxial probe 14, respectively, are discussed in more detail in conjunction with an hereinafter provided description of FIG. 3. The electrical conducting line 19 on the probe card 16 connects the wire probe 12 to testing apparatus 69 (not shown in FIG. 1 but shown in FIG. 3) through conductive mounting structure 17.

It is an important feature of the invention that the capacitor means 38 be mechanically flexible to ensure that the tip 37 of the wire probe 12 and the tips 31, 33, 35 of the coaxial probe 14 make good electrical contact to metal pads (contact areas) of the integrated circuit chip under test independent of any irregularities in the surface of the metal pads, and/or the metal pads or the tips 37 and 33 not being in a common plane.

The probe device 10 can be mounted on a ring which is shown and described in U.S. Pat. No. 4,871,964 (Boll et al.), issued on Oct. 3, 1989 and assigned to the same assignee as the present invention, and which is incorporated herein by reference. This ring can have attached thereto a plurality of probe devices 10 and individual coaxial probes 14. This ring of U.S. Pat. No. 4,871,964 can then be moved so as to facilitate electrical contact of tips of probes 12 and 14 with contact areas of a circuit under test. Probe device 10 can also be mounted on a micropositioner (not shown).

Figure 2:
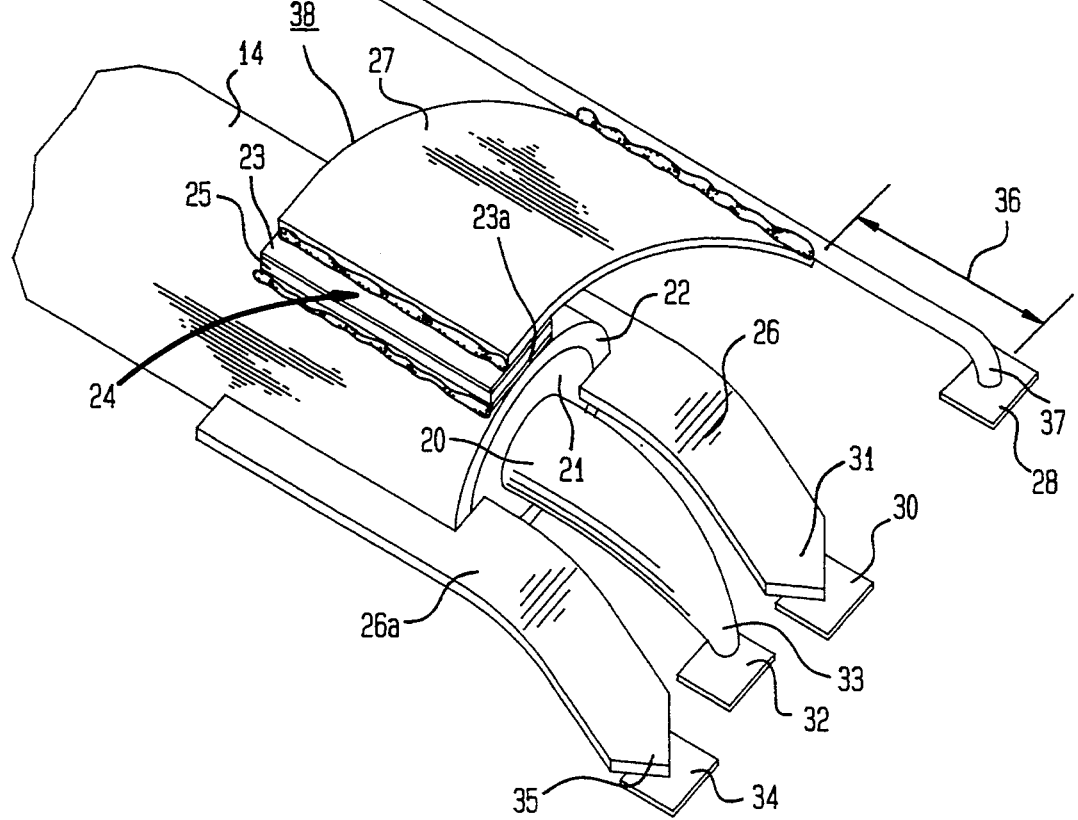
FIG. 2 is an expanded view of an area showing tips of the wire probe and the coaxial probe shown in FIG. 1 in accordance with a first embodiment of the present invention.

Referring now to FIG. 2, there is shown an expanded view of details of tip areas of the wire probe 12 and the coaxial probe 14 of FIG. 1 in accordance with a first embodiment of the present invention. The coaxial probe 14 comprises a center conductor 20 surrounded by an insulating layer 21 which, in turn, is surrounded by an outer shield 22, a first spring leaf extension 26, and a second spring leaf extension 26a. The center conductor 20 is sharpened to form a narrow tip 33 for contacting a metal pad 32 that is part of an integrated circuit chip (not shown except for the metal pad) to be tested. The first spring leaf extension 26 and the second spring leaf extension 26a are connected to opposing sides of the outer shield 22 and extend substantially outward and downward parallel to the center conductor 20 to a first tapered tip 31 and a second tapered tip 35, respectively, for contacting respective metal pads 30 and 34 of the integrated circuit chip (not shown except for the metal pads) to be tested for supplying a reference potential as, for example, ground potential, to the probe device 10 of FIG. 1. More particularly, the metal spring leaf extensions 26 and 26a serve as flexible members to make contact with the metal pads 30 and 34, respectively, while the center conductor 20 makes contact with metal pad 32 of the integrated circuit chip under test. The wire probe 12 is also curved at the tip end to make concurrent contact with a metal pad 28 of the integrated circuit chip under test. It is to be understood that the tip ends of the first and second spring leaf structures 26 and 26a and the center conductor 20, as shown at designation areas 31, 35, and 33, respectively, can comprise any suitable shape to facilitate contacting the respective metal pads 30, 34, and 32 on the integrated circuit chip under test.

The wire probe 12 is connected to the outer shield 22 of the coaxial probe 14 via a serial connection of a thin metal strip (foil) 27 and a capacitor 24. The capacitor 24 is, for example, a chip type capacitor having a top metallic layer 23 and a bottom metallic layer 23a separated by a dielectric layer 25. The top metallic layer 23 of the capacitor 24 is brazed or soldered to the metal strip 27, and the bottom metallic layer 23a is brazed or soldered to the outside surface of the outer shield 22 of the coaxial probe 14. Alternatively, these mechanical and electrical connections can be made by other techniques such as conductive adhesives and spot welding. The capacitor 24 blocks direct current and passes A.C. signals such as radio frequencies when required. Although the capacitor 24 is shown mounted on top of the outer shield 22 of the coaxial probe 14, it is to be understood that the capacitor 24 can be mounted on wire probe 12 or on the side or the bottom of the wire probe 12 or coaxial probe 14. The metal strip 27 is formed from a metal which has dimensions (e.g., as short in length and as large in width as is practical) which limit its inductance. Advantageously, metal strip 27 is bent as shown to enhance its mechanical flexibility. More flexibility can be achieved by a more pronounced bending of metal strip 27 into for example a full half circle or an arched shape. Metal strip 27 and capacitor 24 comprise one embodiment of capacitor means 38.

Figure 3:
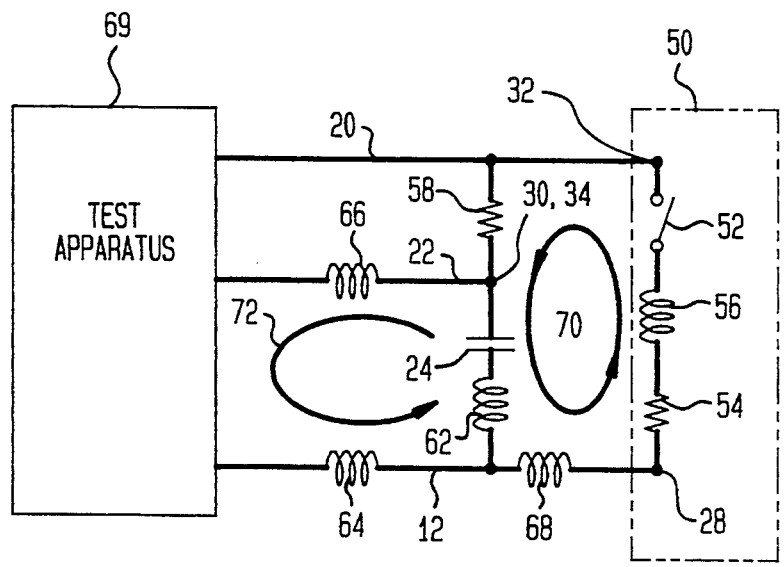
FIG. 3 is a circuit equivalent of the probe device shown in FIGS. 1 and 2 when connected to a integrated circuit chip under test and a test apparatus.

Referring now to FIG. 3, there is shown an equivalent circuit of the probe device 10 of FIG. 1 when connected to an integrated circuit chip 50 (shown within a dashed line rectangle) under test and to a test apparatus 69. The circuit equivalent of pertinent portions of the chip 50 comprises a switch 52 which is connected in series with both a resistor 54 and an inductor 56 (a chip circuit inductor). The equivalent circuit of the probe device 10 comprises a resistor 58 connected in series with both the capacitor 24 (located between the wire probe 12 and the outer shield 22 of the coaxial probe 14 in FIG. 2) and an inductor 62, an inductor 64, an inductor 66, and an inductor 68.

More particularly, the serial connection of the switch 52, the resistor 54, and the inductor 56 represents schematically a portion of the integrated circuit chip 50 under test between the metal pad 32 (contacted by center conductor 20) and the metal pad 28 (contacted by wire probe 12) shown in FIG. 2. The switch 52 represents a transistor (not shown) of the integrated circuit chip 50 which under test is switched on and off during operation of the integrated circuit chip 50 which is facilitated by the application of power thereto from probes 12 and 20. The resistor 58 is connected between the metal pads 32 and 30 (and/or 34) and represents the characteristic impedance of the coaxial probe 14 which is serially connected with the capacitor 24 and the inductor 62 which represents the inductance of the metal strip 27 of FIG. 2. The inductor 68 represents the inductance of a short length 36 (shown in FIG. 2) of the wire probe 12 between the connection of the metal strip 27 and the tip of the wire probe contacting the metal pad 28 of the integrated circuit chip 50. The inductor 64 and the inductor 66 represent the inductances of the wire probe 12 and the outer shield 22 of the coaxial probe 14, respectively, as they connect to the test apparatus 69.

In operation, when a portion of the integrated circuit chip 50 is activated by closing switch 52, electric current flows through the series connection of the switch 52, the resistor 54, and the inductor 56 to send current from the wire probe 12, which supplies power to the integrated circuit chip 50. The outer conductor 22 of the coaxial probe 14 is connected to the wire probe 12 through a series combination of the capacitor 24 and the flexible metal strip 27 (shown in FIG. 2) which is represented by the inductor 62. If the test probes 12 and 14 are to measure the true performance of the circuitry (represented by switch 52, the resistor 54 and the inductor 56) of the integrated circuit chip 50, then the inductor 62 of the flexible metal strip 27 (shown in FIG. 2) and the inductor 68 of the wire probe 12 between the flexible strip 22 and the metal pad 28 contacting wire probe 12 must be as small as possible. This condition requires that the flexible metal strip 27 should be as wide as possible, and the length 36 (shown in FIG. 2) between the connection of the flexible metal strip 27 to the wire probe 12 and the tip of the wire probe 12 at metal pad 28 should be as short as possible. In other words, the total inductance around the loop indicated by the circular arrow 70 should be as small as possible. This loop 70 includes the inductor 56 of the electrical wiring on the integrated circuit chip 50 under test. However, limiting the inductor 56 is the responsibility of a designer of the integrated circuit chip 50 and, therefore, is of no concern of the present invention.

It is important that the flexible metal strip 27 shown in FIG. 2 be very thin so that it is mechanically flexible. This ensures that the tip 37 of the wire probe 12 and the tips 31 and 35 of the metal spring leaf extensions 26 and 26a (shown in FIG. 2) flex independently of each other such that the tips thereof, and the tip 33 of the center conductor 20, make good electrical contact to metal pads (contact areas) 28, 30, 32, and 34 of the integrated circuit chip 50 independent of any irregularities in the surface of the metal pads 28, 30, 32, or 34 on the integrated circuit chip 50, and/or independent of the tips 37, 31, 33, and 35 or the metal pads 28, 30, 32, and 34 being in a common plane. The thickness of the flexible metal strip 27 shown in FIG. 2 is greatly exaggerated for illustrative purposes only.

It is to be understood that inductors 64 and 66 can lead to testing errors because they are part of a circuit loop indicated by curved arrow 72 that can be excited by unavoidable voltage transients that are generated across the capacitor 24 and inductor 62 during the testing of an integrated circuit chip. The capacitor 24 in series with inductor 62, inductor 64, and inductor 66, and whatever circuit elements exist inside a test apparatus 69, form a loop 72 that can generate undesirably large extraneous voltages at resonant frequencies of the loop 72. To reduce these induced extraneous voltages, first and second magnetic or other microwave absorbing materials 13 and 13a can be placed over or around the wire probe 12 and the coaxial probe 14, respectively as is shown in FIG. 1. More particularly, the outer shield 22 of the coaxial probe 14 is surrounded with a layer of a signal absorbing material 13a to reduce the amplitude of any signals induced on the outside of the outer shield 22. Similarly, at least a portion of a length of the wire probe 12 is surrounded with a signal absorbing material 13 to reduce the amplitude of any signals induced on the wire probe 12. Such microwave absorbing material 13 and 13a is well known in the industry and is available, for example, from The Emerson and Cuming Company under the trademark ECCOSORB.

In a typical embodiment of probe device 10, capacitor 24 is in a range of 100 to 1,000 pF. The length of the metal strip 27 is governed by the distance between bonding pads (contact areas of an integrated circuit being tested) and the amount of bending ("looping") of the metal strip 27. The distance between bonding pads is typically 0.01 cm (8 mills). If metal strip 27 is looped to form a full half circle, the strip length will be $\pi/2 \times 0.02$ cm. The thickness of the metal strip 27 is governed by the allowable mechanical "stiffness" or its inverse, the compliance of the metal strip 27. A strip which is 0.05 cm wide and 2 micrometers thick will have a stiffness that is small compared with the stiffness of probe wire 12 or metal leaf springs 26 and 26a. This metal strip has an approximate inductance of 0.04 nanohenrys. It is important that the probe wire 12 and metal leaf springs 26 and 26a be stiffer than the metal strip 27. This helps insure that probe wire 12 and metal leaf springs 26 and 26a make physical and electrical contact with portions of integrated circuit chip 50 such that the amount of force necessary to place these in electrical contact with chip 50 is not limited by the stiffness of metal strip 27. Portion 36 of probe wire 27 has about 0.08 nanohenrys. Metal leaf springs 26 and 26a have about 0.05 nanohenrys. The inductance of the wiring on the integrated circuit under test could be about 0.04 to 0.1 nanohenrys but is a function of what the chip designer chooses. The total inductance around the test loop is the sum of the above and totals about 0.02 to 0.03 nanohenrys. The resistance of the above described metal strip is about 0.03 ohms which is considered negligible in many applications. The metal thickness of metal strip 27 could be reduced by another factor of 10 and the resistance thereof would still be negligible. Accordingly, a flexible capacitor, such as the capacitor 38 (shown in FIG. 4 and not in FIGS. 1-3) of Mylar (a trademark of E.I. dupont de Nemours & Co., Inc.) dielectric, for example, 5 microns thick with 0.2 micrometer metal plates could be used. The thicker Mylar is allowable because Mylar is not as stiff as metal. Another flexible capacitor which is suitable could use an aluminum oxide film as the dielectric with metal films forming the capacitor plates.

The use of capacitor means 38 has been found to significantly increase the frequency range available for testing and has, for example, allowed a test frequency increase from 100 MHz to 5 GHz while maintaining essentially the same accuracy of test results.

Figure 4:
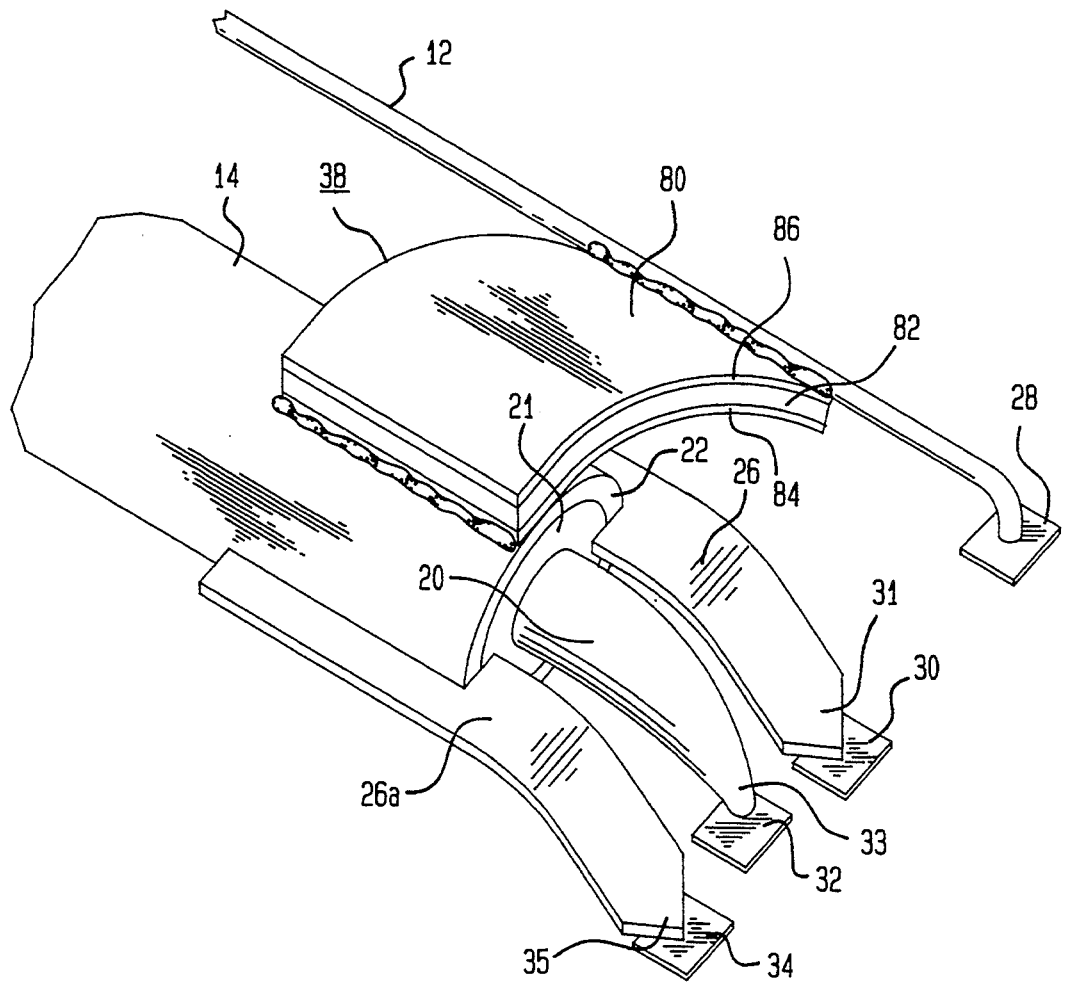
FIG. 4 is an expanded view of an area showing tips of the wire probe and the coaxial probe shown in FIG. 1 in accordance with a second embodiment of the present invention.

Referring now to FIG. 4, there is shown an expanded view of an area near tips of the wire probe 12 and the coaxial probe 14 shown in FIG. 1 in accordance with a second embodiment of the present invention. The coaxial probe 14 comprises a center conductor 20 surrounded by an insulating layer 21 which, in turn, is surrounded by an outer shield 22, a first spring leaf extension 26, and a second spring leaf extension 26a. The center conductor 20 is curved outward and downward towards a narrow tip 33 for connecting a metal pad 32 that is part of an integrated circuit chip (not shown) to be tested. The first spring leaf extension 26 and the second spring leaf extension 26a are connected to opposing sides of the outer shield 22 and extend outward and downward substantially parallel to the center conductor 20 to a first inwardly tapered tip 31 and second inwardly tapered tip 35, respectively, for contacting respective metal pads 30 and 34 of the integrated circuit chip to be tested to supply, for example, ground to the probe device 10 of FIG. 1. More particularly, the metal spring leaf extensions 26 and 26a serve as flexible members to make contact with the metal pads 30 and 34, respectively, while the center conductor 20 makes contact with metal pad 32 of the integrated circuit chip under test. The wire probe 12 is also curved at a tip end to make contact with a metal pad 28 of the integrated circuit chip under test concurrent with the tips 31, 33, and 35 making contact to the metal pads 30, 32, and 34, respectively. It is to be understood that the first and second spring leaf structures 26 and 26a and the center conductor 20 as shown at tip areas 31, 35, and 33, respectively, can comprise any shape to facilitate contacting the respective metal pads 30, 34, and 32 on the integrated circuit chip under test.

The wire probe 12 is connected to the outer shield 22 of the coaxial probe 14 via a flexible capacitor 80. More particularly, the capacitor 80 forms an on element which replaces the flexible metal strip 27 and the capacitor 24 shown in FIG. 2. The capacitor 80 comprises a thin dielectric layer 82 separating a first thin metal layer 84 and a second thin metal layer 86. The first metal layer 84 is connected electrically and mechanically to the outer shield 22 of the coaxial probe 14 by either soldering or brazing them together. The second thin metal layer 86 is connected electrically and mechanically to the wire probe 12 by either soldering or brazing them together. The remaining structure is identical operationally and electrically to the structure shown in FIG. 2 and the circuit arrangement shown in FIG. 3, respectively. The capacitor 80 preferably has dimensions which minimizes its inductance and functions to block direct current and pass radio frequencies when required.

Figure 5:
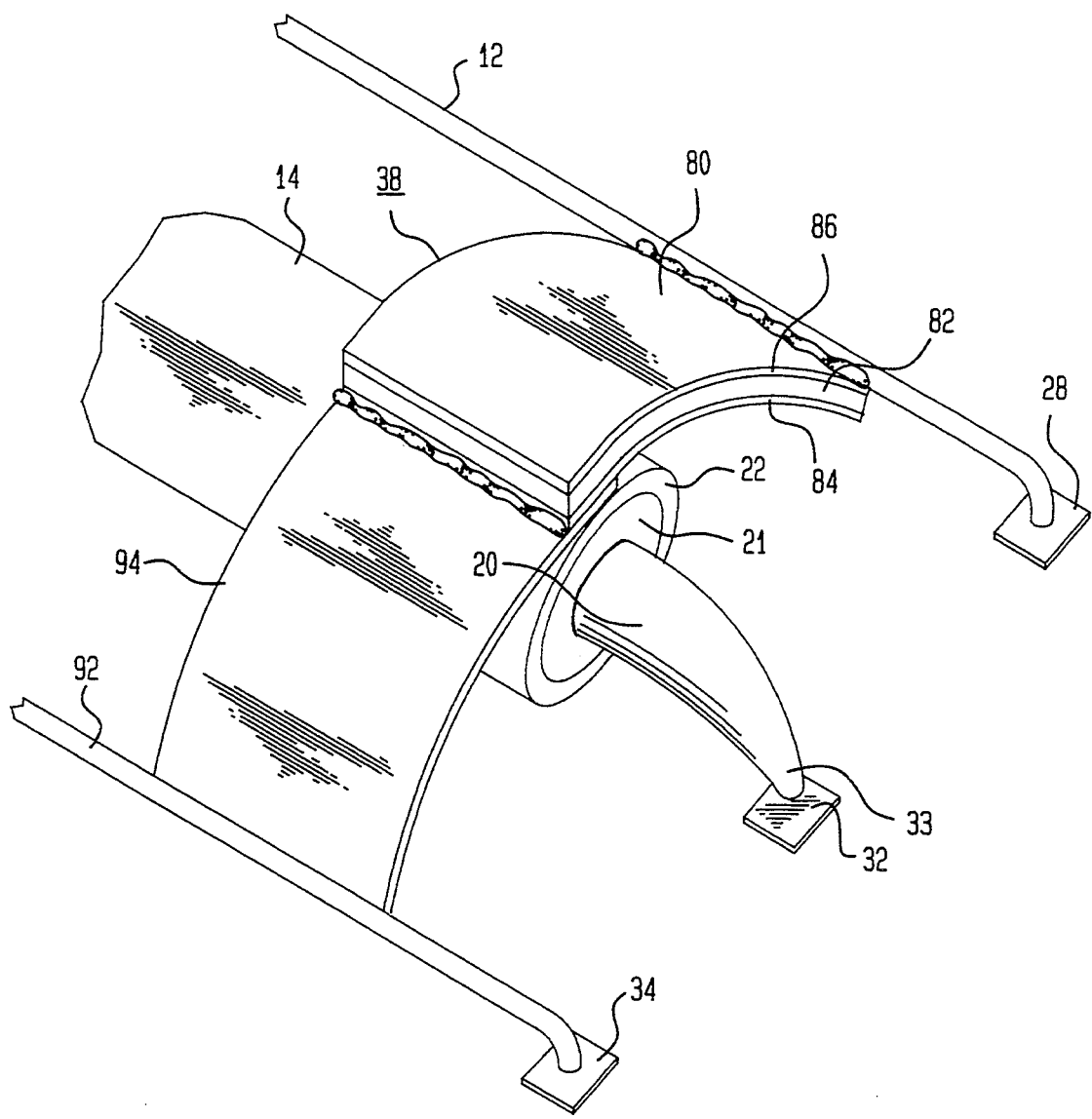
FIG. 5 is an expanded view of an area showing tips of the wire probe and the coaxial probe shown in FIG. 1 in accordance with a third embodiment of the present invention.

Referring now to FIG. 5, there is shown an expanded view of an area near tips of the wire probe 12 and a portion of the coaxial probe 14 shown in FIG. 1 and a second wire probe 92 in accordance with a third embodiment of the present invention. The coaxial probe 14 comprises a center conductor 20 surrounded by an insulating layer 21 which, in turn, is surrounded by an outer shield 22. The center conductor 20 is curved outward and downward towards a narrow tip 33 for contacting a metal pad 32 that is part of an integrated circuit chip (not shown) to be tested. The wire probe 12 is also curved at a tip end to make contact with a metal pad 28 of the integrated circuit chip under test concurrent with the tip 33 making contact to the metal pad 32. It is to be understood that the tip of the wire probe 12 and the tip 33 of the center conductor 20 can comprise any shape to facilitate contacting the metal pads 28 and 32, respectively, on the integrated circuit chip under test. It is to be noted that in the arrangement of FIG. 5 the first and second spring leaf extensions 26 and 26a shown in FIGS. 2 and 4 are omitted. Instead, ground is supplied to the outer shield 22 of the coaxial probe 14 through a second wire probe 92 and a flexible metal strip 94. The second wire probe 92 is curved downward (similar to first wire probe 12) to make contact with a metal pad 34 on the integrated circuit chip under test. If required, power can be supplied through wire probe 12 using either the arrangement of the capacitor 24 and flexible metal strip 27 of FIG. 2 or just the capacitor 80 shown in FIG. 4.

The arrangement of FIG. 5 shows the use of the flexible capacitor 80 electrically and mechanically connected between the first wire probe 12 and the flexible metal strip 94 which engages the outer shield 22 of the coaxial probe 14. The capacitor 80 comprises a thin dielectric layer 82 separating a first thin metal layer 84 and a second thin metal layer 86. The first metal layer 84 is connected electrically and mechanically to the flexible metal strip 94 by either soldering or brazing them together. The second thin metal layer 86 is connected electrically and mechanically to the wire probe 12 by either soldering or brazing them together. The remaining structure is identical operationally and electrically to the structure shown in FIG. 2 and the circuit arrangement shown in FIG. 3, respectively. The structure of FIG. 5 has an advantage over the structures of FIGS. 2 and 4 in that the coaxial probe 14 is of a much simpler design which is easier to fabricate. At the same time the structure of FIG. 5 has a disadvantage in that it cannot produce measurements which are as precise at high frequencies as measurements possible using the structures of FIGS. 2 and 4.

Figure 6:
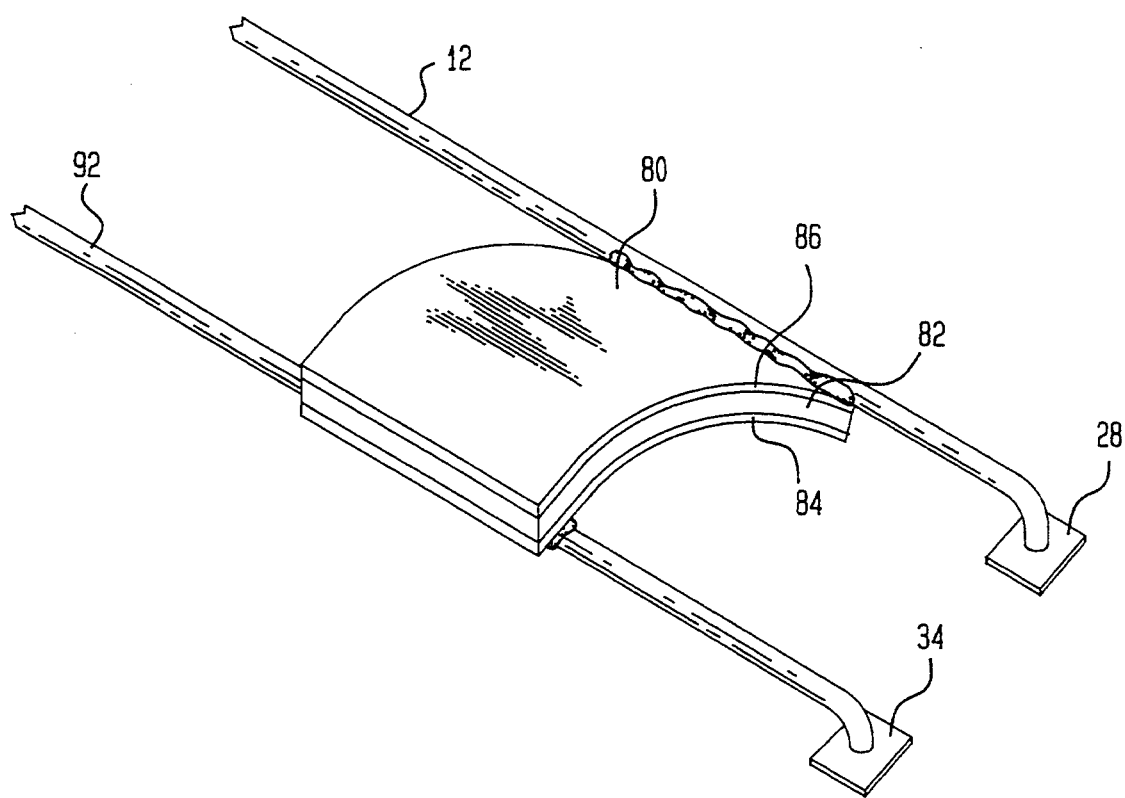
FIG. 6 is an expanded view of an area showing tips of the wire probe and a portion of the coaxial probe shown in FIG. 1 in accordance with a fourth embodiment of the present invention.

Referring now to FIG. 6, there is shown an expanded view of an area near tips of a first wire probe 12 and a second wire probe 92 in accordance with a fourth embodiment of the present invention. Essentially the structure of FIG. 6 is similar to the structure of FIG. 5 without the use of the coaxial probe 14. The first wire probe 12 and the second wire probe 92 have tips which are spaced to engage metal pads 28 and 34, respectively, of an integrated circuit chip (not shown) under test. Still further, the first wire probe 12 and the second wire probe 92 are interconnected near their tip ends via a thin foil capacitor 80 comprising a thin dielectric layer 82 separating a first thin metal layer 84 and a second thin metal layer 86. The first metal layer 84 is connected electrically and mechanically to the second wire probe 92 by either soldering or brazing them together. The second thin metal layer 86 is connected electrically and mechanically to the wire probe 12 by either soldering or brazing them together. The structure of FIG. 6 is useful for supplying power and ground to an integrated circuit chip in which no transmission line is employed, or where the transmission line makes contact to the integrated circuit chip in an area far removed from the power supply connections. One of the probes (e.g., second wire probe 92) can be the ground or common connection, and the other probe (e.g., first wire probe 12) can supply the power. The strip capacitor 80 provides a low impedance connection to bypass A.C. signals such as radio frequency currents flowing between the power and ground terminals. It is to be understood that the arrangement of the capacitor 24 and flexible metal strip 27 of FIG. 2 can replace the foil capacitor 80 in FIG. 6.

It is to be understood that the specific designs described in the first, second, third, and fourth embodiments are merely illustrative of the spirit and scope of the invention. Modifications can be made in the specific designs consistent with the principles of the invention. The descriptions provided hereinbefore of the various embodiments of the invention are directed to a testing of integrated circuit chips while they are still a part of a semiconductor wafer. However, it is to be understood that such probe designs can also be used to test chips already separated from the semiconductor wafer. Still further, the probe designs of the invention can be used to test chips already mounted on a circuit board or a ceramic substrate. In such case, the tips of the wire probe 12 and the coaxial probe 14 and/or second wire probe 92 make contact to the metallized conductors on the substrate instead of the contact pads 28, 30, 32, 24, and 38 on the chip. Additionally, although a coaxial probe 14 is shown in FIGS. 2, 4, and 5 for carrying a microwave signal to the test apparatus 69 (shown in FIG. 3), a twinline, stripline, or coplanar line can be used in place of the coaxial probe 14. Still further, the probes 12 and 14 can be fixed to probe card 16 in a variety of different ways other than through the use of mounting structures 17 and 18.

What is claimed is:

1. An electronic probe testing apparatus for use in testing a circuit and providing electrical signals between the circuit to be tested and a testing apparatus during a testing of the circuit comprising:
   a first probe which is useful for making an electrical connection to at least one first point of the circuit to be tested;
   a second probe which is useful for making contact and supplying power to a second point of the circuit to be tested, the second probe being in a predetermined spaced-apart relationship to the first probe; and
   capacitor means having a predetermined capacitance for capacitively coupling the first and second probes, comprising a first terminal which is electrically connected to the first probe and a second terminal which is electrically connected to the second probe, the capacitor means being flexible so as to facilitate independent movement of the first and second probes so as to facilitate contacting of the first and second points, respectively, of the circuit during testing thereof without substantially changing the predetermined capacitance thereof.

2. The electronic probe testing apparatus of claim 1 wherein the first probe provides an essentially resistive impedance and comprises a transmission line comprising a first conductor and a second conductor separated by an insulating medium, a first end of the transmission line probe being adapted to contact the first point of the circuit to be tested.

3. The electronic probe testing apparatus of claim 2 wherein the transmission line is a coaxial line comprising a center conductor and an outer shield separated by an insulating medium.

4. The electronic probe testing apparatus of claim 3 further comprising a signal absorbing material surrounding at least a portion of a length of the outer shield of the coaxial line so as to reduce the amplitude of any signals induced on the outside of the outer shield during use of the electronic probe testing apparatus.

5. The electronic probe testing apparatus of claim 3 further comprising a third probe forming a wire probe which is useful for supplying a reference potential to a third point of the circuit to be tested during use of the electronic probe testing apparatus, the third probe being in a spaced-apart relationship to the first and second probes.

6. The electronic probe testing apparatus of claim 1 further comprising a third probe forming a wire probe which is useful for supplying a reference potential to a third point of the circuit to be tested during use of the electronic probe testing apparatus, the third probe being in a predetermined spaced-apart relationship to the first and second probes.

7. The electronic probe testing apparatus of claim 1 further comprising a signal absorbing material surrounding at least a portion of a length of the second probe so as to reduce the amplitude of any signals induced on the second probe during use of the electronic probe testing apparatus.

8. The electronic probe testing apparatus of claim 1 wherein the capacitor means comprises:
   a capacitor comprising a first metallic conductor which is electrically connected to one of the first and second probes, a second metallic conductor, and an insulating medium separating the first and second metallic conductors; and
   an electrically conducting metallic strip having a first end which is electrically and mechanically connected to the other one of the first and second probes, and an opposing second end which is electrically and mechanically connected to the second metallic conductor of the capacitor, the metallic strip having dimensions which limits inductance thereof and provides sufficient flexibility so as to facilitate independent movement of the first and second probes.

9. The electronic probe testing apparatus of claim 1 wherein the second probe is stiffer than the capacitor means and a portion of the first probe which is useful for making an electrical connection to the circuit to be tested is stiffer than the capacitor means.

10. The electronic probe testing apparatus of claim 1 further comprising positioning means which is useful to facilitate accurate positioning of the first and second probes in three dimensions so as to bring tips of the first and second probes in contact with the first and second points, respectively, of the circuit under test.

11. The electronic probe testing apparatus of claim 1 wherein the capacitor means comprises a foil type capacitor comprising a first conductor which is electrically and mechanically connected to the first probe, a second conductor which is electrically and mechanically connected to the second probe, and an insulating medium separating the first and second conductors, the capacitor having sufficiently flexibility so as to facilitate independent movement of the first and second probes.

12. An electronic probe testing apparatus for use in testing a circuit and providing electrical signals between the circuit to be tested and a testing apparatus during a testing of the circuit comprising:
   a first probe comprising a transmission line having a first conductor and a second conductor separated by an insulating medium that provides an essentially resistive impedance, a first end of the first probe being adapted to contact the at least one first point of the circuit to be tested;
   a second probe which is useful for making contact and supplying power to a second point of the circuit to be tested, the second probe being in a predetermined spaced-apart relationship to the first probe; and
   a capacitor having a predetermined capacitance and comprising a first metallic conductor which is electrically connected to one of the first probe and the second probe, a second metallic conductor connected to the other one of the first probe and the second probe, and an insulating medium separating the first and second metallic conductors, the capacitor having dimensions which limits inductance thereof and sufficient flexibility to facilitate independent movement of the first probe and the second probe without substantially changing the predetermined capacitance thereof.

13. The electronic probe testing apparatus of claim 12 wherein the first probe is a coaxial line comprising a center conductor and an outer shield separated by an insulating medium.

14. The electronic probe testing apparatus of claim 13 further comprising a signal absorbing material surrounding at least a portion of a length of the outer shield of the coaxial line so as to reduce the amplitude of any signals induced on the outside of the outer shield during use of the electronic probe testing apparatus.

15. The electronic probe testing apparatus of claim 13 further comprising a third probe in the form of a wire probe which is useful for supplying a reference potential to a third point of the circuit to be tested during use of the electronic probe testing apparatus, the third probe being in a predetermined spaced-apart relationship to the first and second probes.

16. The electronic probe testing apparatus of claim 12 further comprising a third probe in the form of a wire probe which is useful for supplying a reference potential to a third point of the circuit to be tested during use of the electronic probe testing apparatus, the third probe being in a predetermined spaced-apart relationship to the first and second probes.

17. The electronic probe testing apparatus of claim 12 further comprising a signal absorbing material surrounding at least a portion of a length of the second probe so as to reduce the amplitude of any signals induced on the second probe during use of the electronic probe testing apparatus.

18. The electronic probe testing apparatus of claim 12 further comprising positioning means for facilitating accurate positioning of the first probe and the second probe in three dimensions so as to bring tips of the first probe and the second probe in contact with the first and second points, respectively, of the circuit under test.

19. The electronic probe testing apparatus of claim 12 wherein the capacitor means comprises a foil type capacitor comprising a first conductor which is electrically and mechanically connected to the first probe, a second conductor which is electrically and mechanically connected to the second probe, and an insulating medium separating the first and second conductors, the capacitor being sufficiently flexible so as to facilitate independent movement of the first probe and the second probe.

20. An electronic probe testing apparatus for use in testing a circuit and providing electrical signals between the circuit to be tested and a testing apparatus during a testing of the circuit comprising:
   a transmission line probe that provides an essentially resistive impedance and comprises a first conductor and a second conductor separated by an insulating medium, a first end of the transmission line probe being adapted to contact at least one first point of the circuit to be tested;

a wire probe which is useful for making contact and supplying power to a second point of the circuit to be tested, the wire probe being in a predetermined spaced-apart relationship to the transmission line probe;

a capacitor having a predetermined capacitance and comprising a first metallic conductor which is electrically connected to one of the transmission line probe and the wire probe, a second metallic conductor, and an insulating medium separating the first and second metallic conductors;

an electrically conducting metallic strip having a first end which is electrically connected to the other one of the transmission line probe and the wire probe, and an opposing second end which is electrically and mechanically connected to the second metallic conductor of the capacitor, the metallic strip having dimensions which limits inductance thereof and provides for sufficient flexibility so as to facilitate independent movement of the transmission line probe and the wire probe without substantially changing the predetermined capacitance of the capacitor.

21. The electronic probe testing apparatus of claim 20 wherein the transmission line probe is a coaxial line comprising a center conductor and an outer shield separated by an insulating medium.

22. The electronic probe testing apparatus of claim 21 further comprising a signal absorbing material surrounding at least a portion of a length of the outer shield of the coaxial line so as to reduce the amplitude of any signals induced on the outside of the outer shield during use of the electronic probe testing apparatus.

23. The electronic probe testing apparatus of claim 20 further comprising a second wire probe which is useful for supplying a reference potential to a third point of the circuit to be tested during use of the electronic probe testing apparatus, the second probe being in a predetermined spaced-apart relationship to the transmission line probe and the first probe.

24. The electronic probe testing apparatus of claim 23 further comprising a second flexible metal strip having a first end which is electrically and mechanically connected to the second wire probe, and an opposing second end which is electrically connected to the second metallic conductor of the capacitor and to one of the first and second conductors of the transmission line probe, the metallic strip having dimensions which limits inductance thereof and provides for sufficient flexibility so as to facilitate independent movement of the second wire probe and the transmission line probe.

25. The electronic probe testing apparatus of claim 20 further comprising a signal absorbing material surrounding at least a portion of a length of the wire probe so as to reduce the amplitude of any signals induced on the wire probe during use of the electronic probe testing apparatus.

26. The electronic probe testing apparatus of claim 20 further comprising positioning means which is useful to facilitate accurate positioning of the transmission line probe and the wire probe in three dimensions so as to bring tips of the transmission line probe and the wire probe in contact with the first and second points, respectively, of the circuit under test.

27. An electronic probe testing apparatus for use in testing a circuit and providing electrical signals between the circuit to be tested and a testing apparatus during a testing of the circuit comprising:

a first wire probe which is useful for supplying a reference potential to a first point of the circuit to be tested;

a second wire probe which is useful for supplying power to a second point of the circuit to be tested, the second probe being in a predetermined spaced-apart relationship to the first probe; and capacitor means having a predetermined comprising a first terminal which is electrically connected to the first wire probe and a second terminal which is electrically connected to the second wire probe, the capacitor means having a flexibility so as to facilitate independent movement of the first and second wire probes for contacting the first and second points, respectively, of the circuit to be tested without substantially changing the predetermined capacitance thereof.

28. The electronic probe testing apparatus of claim 27 wherein the capacitor means comprises:

a capacitor comprising a first metallic conductor which is electrically connected to one of the first and second wire probes, a second metallic conductor, and an insulating medium separating the first and second metallic conductors; and an electrically conducting metallic strip having a first end which is electrically connected to the other one of the first and second wire probes, and an opposing second end which is electrically and mechanically connected to the second metallic conductor of the capacitor, the metallic strip having dimensions which limits inductance thereof and provides sufficient flexibility so as to facilitate independent movement of the first and second wire probes.

29. The electronic probe testing apparatus of claim 27 further comprising positioning means which is useful to facilitate accurate positioning of the first and second wire probes in three dimensions so as to bring tips of the first and second wire probes in contact with the first and second points, respectively, of the circuit under test.

30. The electronic probe testing apparatus of claim 27 wherein the capacitor means comprises a foil type capacitor comprising a first conductor which is electrically and mechanically connected to the first wire probe, a second conductor which is electrically and mechanically connected to the second wire probe, and an insulating medium separating the first and second conductors, the capacitor being sufficiently flexible so as to facilitate independent movement of the first and second wire probes.

31. The electronic probe testing apparatus of claim 1 wherein the second probe is a wire probe.

32. Electronic probe testing apparatus comprising:

a first probe which is useful for making an electrical connection to at least one first point of an electrical device to be tested;

a second probe which is useful for making an electrical connection to a second point of the electrical device, the second probe being in a predetermined spaced-apart relationship to the first probe; and capacitor means, which has a predetermined capacitance, for capacitively coupling the first and second probes, the capacitor means comprising a first terminal which is electrically connected to the first probe and a second terminal which is electrically connected to the second probe and being sufficiently flexible to facilitate independent movement of the first and second probes so as to facilitate contacting of the first and second points, respectively, of the electrical device during testing thereof without substantially changing the predetermined capacitance thereof.

* * * * *